United States Patent [19]

Gobin et al.

[11] Patent Number: 5,050,416
[45] Date of Patent: Sep. 24, 1991

[54] SEALING ELEMENT FOR FEEDING THROUGH AT LEAST ONE ELONGATED OBJECT SUCH AS WIRE AND A VACUUM APPARATUS PROVIDED WITH ONE OR MORE OF SEALING ELEMENTS

[75] Inventors: Guy Gobin, Oostende; Geert De Doncker, Bellem; Alex Colpaert, Zulte; Norbert Van Wassenhove, Merelbeke; Robert Hoogewijs, De Pinte; Lucien Fiermans, Gent; Roger De Gryse, Oosterzele; Joost Vennik, Aalter, all of Belgium

[73] Assignee: N.V. Bekaert S.A., Zwevegem, Belgium

[21] Appl. No.: 430,288

[22] Filed: Nov. 2, 1989

[30] Foreign Application Priority Data

Nov. 16, 1988 [NL] Netherlands ............ 8802822

[51] Int. Cl.⁵ ................ B21B 9/00; F16J 15/00
[52] U.S. Cl. ........................ 72/38; 277/12; 277/192; 277/193
[58] Field of Search ............ 277/192, 193, 199, 12; 72/38; 174/152 G; 29/DIG. 44; 34/242

[56] References Cited

U.S. PATENT DOCUMENTS

| | | | |
|---|---|---|---|
| 1,948,485 | 2/1934 | Anselm | 72/38 |
| 2,006,931 | 7/1935 | Powers | 174/152 G |
| 2,968,505 | 1/1961 | Scaramucci | 277/199 |
| 3,669,065 | 6/1972 | Smart | 118/48 |
| 3,952,568 | 4/1976 | Wareing | 29/DIG. 44 |
| 4,054,044 | 10/1977 | Wareing et al. | 72/38 |
| 4,787,227 | 11/1988 | Lievens et al. | 72/38 |
| 4,811,583 | 3/1989 | Lievens et al. | 72/38 |

FOREIGN PATENT DOCUMENTS

| | | |
|---|---|---|
| 0266818 | 5/1988 | European Pat. Off. |
| 0272710 | 6/1988 | European Pat. Off. |
| 1545284 | 11/1967 | France |
| 2315645 | 1/1977 | France |
| 86.02661 | 5/1988 | Netherlands |

Primary Examiner—Allan N. Shoap
Attorney, Agent, or Firm—Foley & Lardner

[57] ABSTRACT

The invention relates to a sealing element to be applied when feeding at least one elongated object through a vacuum apparatus, the sealing element comprising a casing with a first detachable part having a projection on its underside that tapers from a first end of the casing to a second end of the casing and a second detachable part having a hollow portion that tapers from the first end of the casing to the second end. The projection fits in and partially fills the hollow portion creating a gap between the projection and the hollow portion. The second detachable part has a groove around a portion of its perimeter on an upper surface which contains a resilient sealing means that allows the first and second detachable parts to be sealed when abutted against one another.

10 Claims, 2 Drawing Sheets

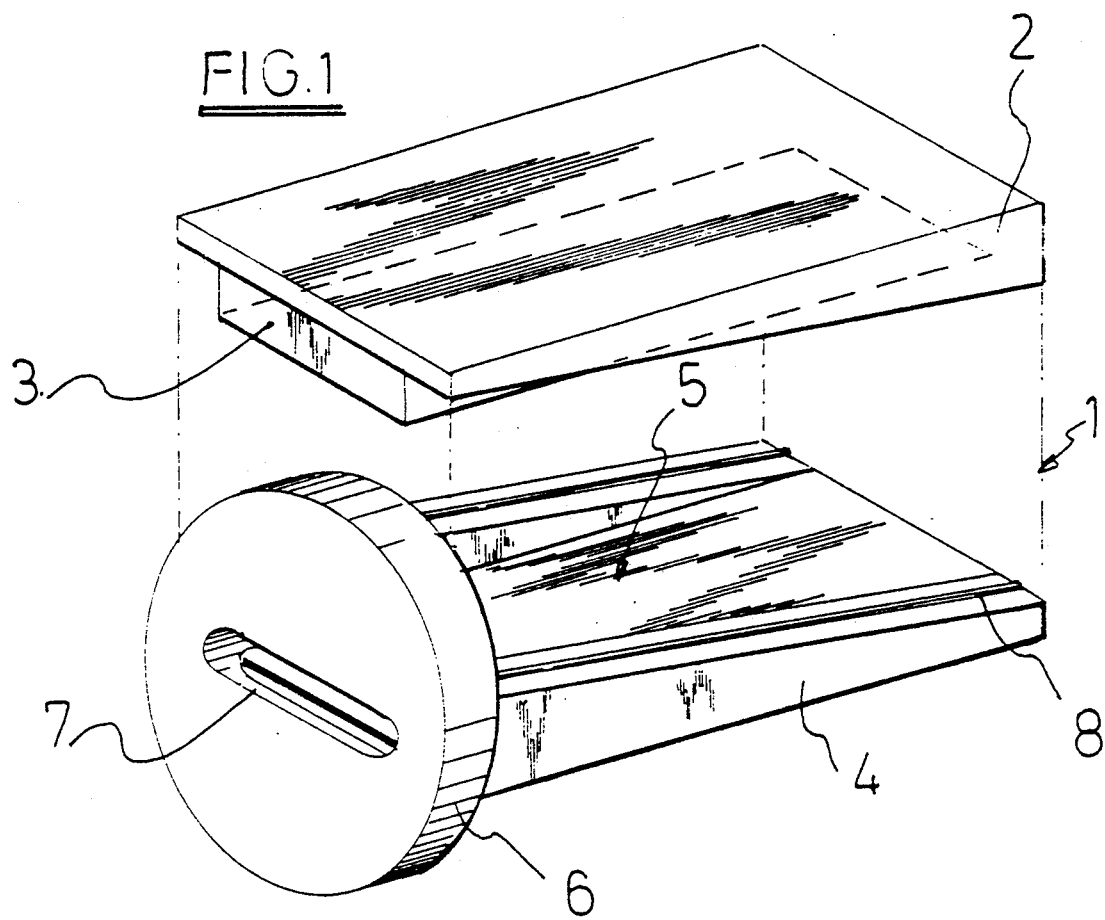
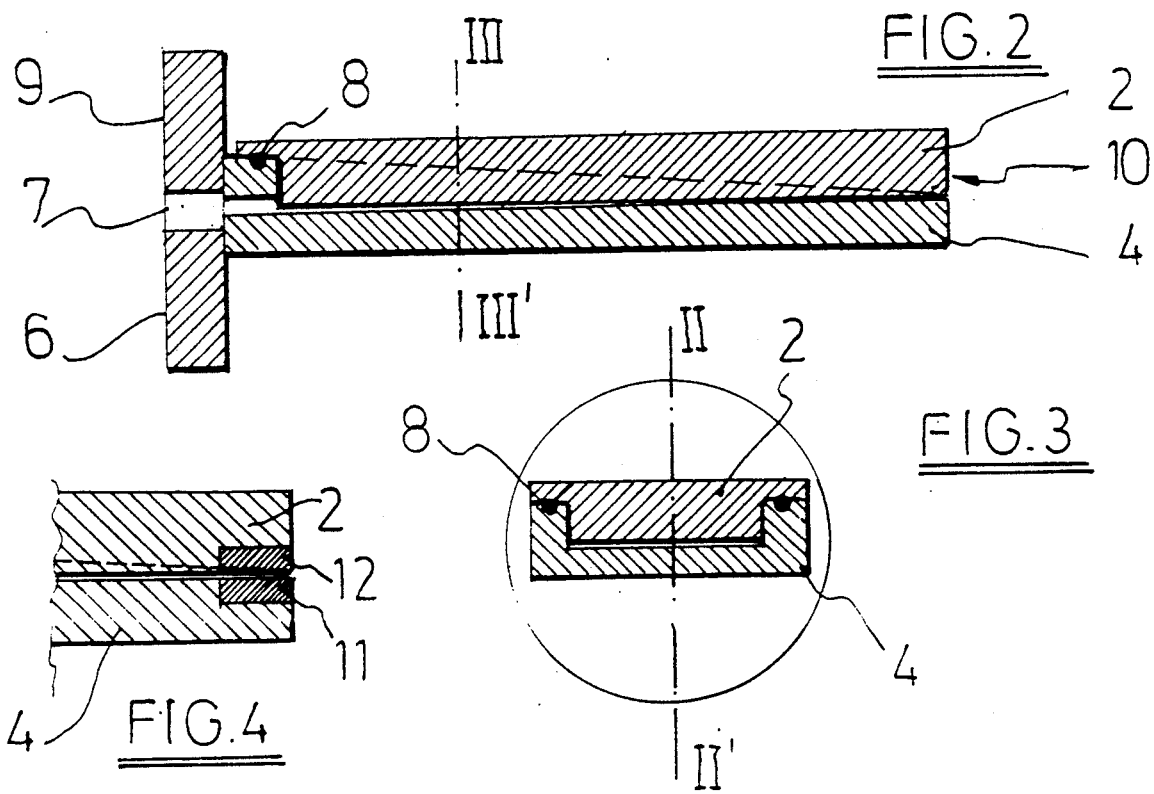

SEALING ELEMENT FOR FEEDING THROUGH AT LEAST ONE ELONGATED OBJECT SUCH AS WIRE AND A VACUUM APPARATUS PROVIDED WITH ONE OR MORE OF SEALING ELEMENTS

BACKGROUND OF THE INVENTION

1. Field of the Invention

The invention relates in the first instance to a sealing element which is used when feeding at least one elongated object such as wire, strip foil, or bundles of wire through the wall of a vacuum apparatus. The sealing element comprises at least a tubular casing that can be attached to and sealed in the wall of the vacuum apparatus and which has an inside cross-sectional area that is larger than the cross-sectional area of the elongated object.

2. Description of the Related Art

Such a sealing element for application with a wire is known from the Dutch patent application 8602661 or European patent application No. 0266818 of the present applicant.

In said application a sealing element is described that can be fitted into the wall of a vacuum apparatus. The sealing element has a casing the length and the free surface of which are dimensioned in such a way that the leakage of ambient air into the interior of the apparatus is reduced when feeding a wire through so that the pumps connected to the vacuum apparatus, which have a normal, sufficient capacity, are well able to attain and maintain the required vacuum.

It has been found when applying such a known sealing element that the required length of the casing can be so long that major practical difficulties are encountered when leading a wire in at one side of the apparatus and leading it out at the other side. This procedure is necessary, for example, when the wire ruptures. The time it takes to lead the wire into one side of the apparatus and out the other side has a detrimental effect on a good production process.

SUMMARY OF THE INVENTION

It is the object of the present invention to provide a solution to this drawback by providing a sealing element in accordance with the invention, comprising a casing with two or more detachable parts that together constitute at least part of the casing length and that abut in a sealing relation creating a gap therebetween that extends along the casing length and which is minimally sufficient to allow a wire to be fed through.

The application of a casing that consists of several parts allows a wire to be fed through very simply and quickly in the event of a wire rupture but also when starting the vacuum apparatus. A simple laying-in of the wire can take place by removing one part of the casing, while the leadingout of a wire at the other side of the vacuum also becomes very simple by removing a part of the casing of the sealing element at that end. Reattaching the casing parts also takes place very simply and quickly.

The gap in the casing is relatively large at the place of attachment of sealing element to the vacuum apparatus so that the feeding-through of the wire is in no way hampered. If so desired, even relatively thick, rigid wires or tubes can be fed through the vacuum apparatus without encountering obstructions.

In a particular embodiment of the sealing element in accordance with the invention, the size of the gap gradually decreases in the direction of the side opposite the attachment side.

By applying such a taper to the gap, a further increase in the resistance against inflow of air into the sealing element is obtained.

The description given hereinbefore started from the assumption that the sealing element is applied when leading one single wire into and out of a vacuum apparatus.

In many cases, it will be desirable to feed several wires through a vacuum apparatus at the same time. To that end, the sealing element in accordance with the invention has a gap with a rectangular cross-section.

In another aspect of the invention, the use of casing parts that are in the shape of sheets and which are abutted and sealed through the insertion of a resilient sealing means, limits the inflow of ambient air into the sealing element. The inflow of air only takes place via the remaining free surface at the side opposite the attachment side.

The free surface is defined as the difference between the cross-sectional area of the gap and the total surface that corresponds to the cross-sectional area of the wires being fed through.

In yet another aspect of the invention, one sheet-shaped part of the casing comprises a hollow, whereas the other part of the casing comprises a projection that fits into the hollow. The hollow and the projection can be adjusted relative to each other in such a way that a gap is obtained that is constant over the whole length of the casing. In addition, the hollow and the projection can be adjusted so that the gap in which wire is fed through, decreases in the direction of the side of the casing opposite the attachment side of the casing.

A certain degree of wear of the casing material can occur when feeding wire through the relatively narrow aperture at the side opposite the attachment side.

Thus, in another aspect of the invention, to advantageously reduce wear, the side opposite the attachment side is provided with detachably mounted inserts connected to each detachable casing part and between which the wires are fed through. In particular, these inserts can be made of a wear-resistant material such as silicon carbide, tungsten carbide, aluminum oxide and the like.

The invention also relates to a vacuum apparatus for the treatment of wire-shaped material provided with one or more sealing elements for continuously leading wire material into and out of the vacuum apparatus, characterized in that one or more sealing elements are applied as described hereinbefore in accordance with the invention.

BRIEF DESCRIPTION OF THE DRAWINGS

The invention will hereinafter be described with reference to the drawing, in which:

FIG. 1 represents a perspective view of a sealing element in accordance with the invention, the sheet-shaped parts of the element being detached from each other;

FIG. 2 represents a section along line II—II' in FIG. 3 through the sealing element in accordance with the invention;

FIG. 3 represents a section along line III—III' through the sealing element according of FIG. 2; and FIG. 4 is a partial sectional view of a sealing element that is provided with wear-resistant inserts.

FIG. 1 shows a sealing element 1 that is suitable for feeding through several wires such as steel wires at the same time.

Figure 5:
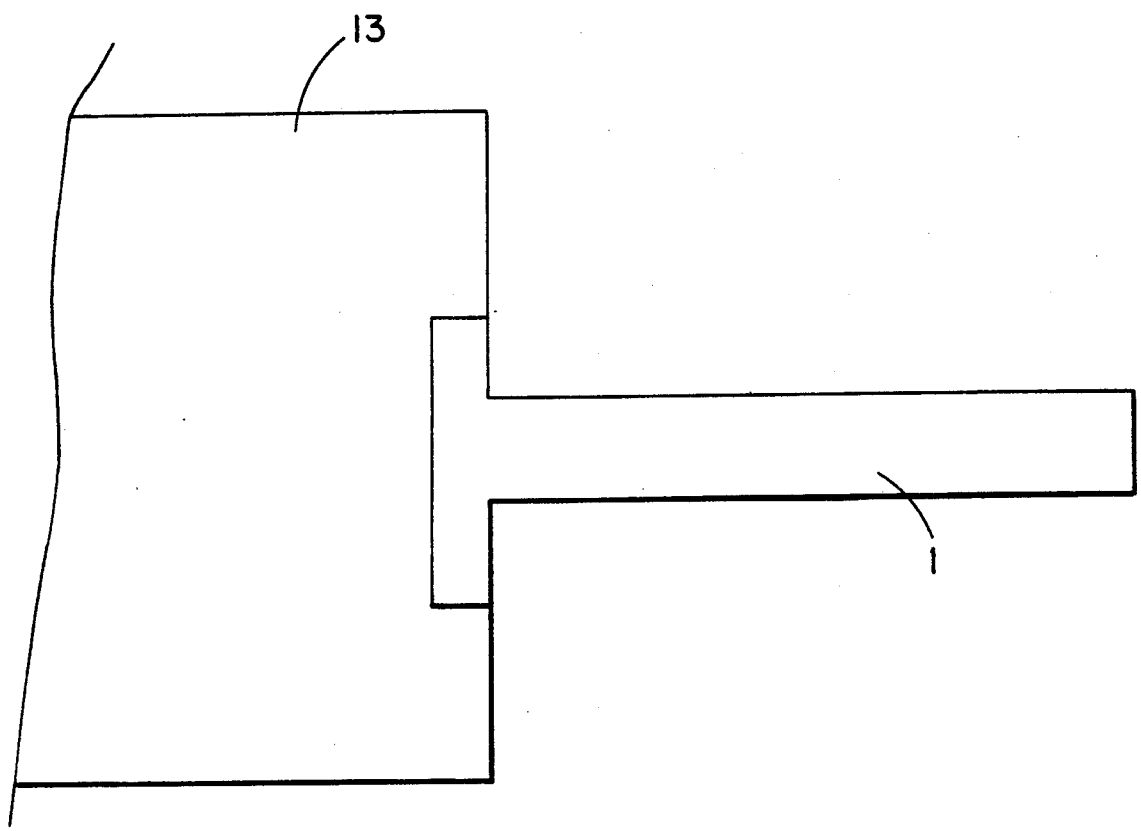
FIG. 5 is a side view of a sealing element in the well of a vacuum apparatus.

The sealing element 1 comprises a casing that consists of the parts 2 and 4, the casing part 2 having a projection 3 on its underside and the casing part 4 having a hollow 5 on its upper surface. The projection 3 and the hollow 5 fit together. A resilient sealing means 8 is present in the casing part 4 for sealing the conjunction of the sheet-shaped parts 2 and 4.

The projection 3 and the hollow 5 are adjusted to each other in such a way that a gap is created between them. Wires are fed through the gap and into an aperture 7 made in the flange 6. Flange 6 is attached onto or into the wall of a vacuum apparatus 13.

When wire is being fed through the sealing element, the sheet-shaped casing part 2 is removed from the sheet-shaped casing part making it easier to feed the wire into the vacuum apparatus. The size of the aperture 7 is such that several wires can be fed through effortlessly at the same time. When the wire or wires have been fed through the vacuum apparatus 13 and through a sealing element at the other side of the apparatus, using auxiliary means if so desired, the sheet-shaped part 2 is put back in its place and attached in sealing relation onto the sheet-shaped casing part 4. The means of attachment can consist of simple screws or it is possible to use clamping means that are simple to operate and with which a sealing conjunction of the casing parts 2 and 4 can be effected by a simple movement of the hand.

By varying the diameter of the sealing means 8, the gap can be varied as well. Preferably, however, spacers or distance pieces are used to regulate the gap area.

FIG. 2 is a sectional representation of the sealing element 1 of FIG. 1. The same parts are indicated with the same reference numbers. The attachment side of the sealing element is indicated with 9 and the opposite side is indicated with 10. The sealing means 8 is fitted in a groove that extends over three of the four perimeter sides of the casing leaving on one perimeter side only an opening which is connected to the ambient air and through which a number of wires can be fed.

In FIG. 2 it is shown that the opening of the space left between the sheets 2 and 4 decreases from the attachment side 9 to the opposite side 10.

FIG. 3 represents a section through the sealing element of FIG. 1 and along line III—III' in FIG. 2.

Here too, the location of the sealing means 8 is clearly visible.

FIG. 4 shows at the opposite side 10 that the sealing element is provided with wear-resistant inserts 11 and 12 which are attached to parts 4 and 2 respectively, and which prevent wearing out of parts 2 and 4.

The sealing element described hereinbefore can be applied when treating wire-shaped material in a vacuum apparatus 13. In this context, a vacuum apparatus 13 is to be understood as referring to an apparatus that can carry out a treatment at a pressure that is lower than the atmospheric pressure. The treatments in mind are treatments such as vacuum coating, cathode sputtering, plasma deposition, sputter etching etc.

In the above and foregoing, the sealing element has been described mainly as a sealing element for application with wire-shaped material.

While the above described sealing element can be used for application with several wires at the same time, it can also be used for feeding a band or strip-shaped material through a vacuum apparatus. Excellent results are also obtained when using the sealing element in accordance with the invention when treating materials that deviate in shape from the wire shape.

What is claimed is:

1. A sealing element for application in a vacuum apparatus for the continuous feeding therethrough of at least one elongated object, said sealing element comprising:
    a) a casing comprising first and second ends and first and second detachable parts, said first detachable part having an underside with a projection thereon, said projection having a longitudinal cross-sectional area that increases in a direction from said second end to said first end, said second detachable part having a hollow portion with a longitudinal cross-sectional area that decreases in a direction from said first end to said second end, the projection fitting in and partially filling the hollow portion and including a gap between said hollow portion and a lower planar surface of said projection, said second detachable part having a groove extending around a portion of the perimeter of an upper surface thereof;
    b) a resilient sealing means in said groove for providing a seal when the underside of the first detachable part abuts against the upper surface of said second detachable part, said resilient sealing means resting against the underside of the first detachable part.

2. A sealing element in accordance with claim 1, wherein said gap gradually decreases in size in a direction from said first end to said second end.

3. A sealing element in accordance with claim 1, wherein said gap has a rectangular cross-section in a plane perpendicular to a longitudinal axis of said casing.

4. A sealing element in accordance with claim 1, wherein said second end has first and second detachably-mounted inserts which are attached to the underside of said first detachable part and the upper surface of said second detachable part, respectively.

5. A sealing element in accordance with claim 4, wherein said inserts are made of wear-resistant materials.

6. A vacuum apparatus, for the treatment of wire-shaped material, provided with at least one sealing element for continuously loading the wire-shaped material into and out of said vacuum apparatus, comprising:
    a) a casing comprising first and second ends and first and second detachable parts, said first detachable part having an underside with a projection thereon, said projection having a longitudinal cross-sectional area that increases in a direction from said second end to said first end, said second detachable part having a hollow portion with a longitudinal cross-sectional area that decreases in a direction from said first end to said second end, the projection fitting in and partially filling the hollow portion and including a gap between said hollow portion and a lower planar surface of said projection, said second detachable part having a groove extending around a portion of the perimeter of an upper surface thereof;
    b) a resilient sealing means in said groove for providing a seal when the underside of the first detachable part abuts against the upper surface of said second detachable part, said resilient sealing means resting against the underside of the first detachable part.

7. A vacuum apparatus in accordance with claim 6, wherein said gap gradually decreases in size in a direction from said first end to said second end.

8. A vacuum apparatus in accordance with claim 6, wherein said gap has a rectangular cross-section in a plane perpendicular to a longitudinal axis of said casing.

9. A vacuum apparatus in accordance with claim 6, wherein said second end has first and second detachably-mounted inserts which are attached to the underside of said first detachable part and the upper surface of said second detachable part, respectively.

10. A vacuum apparatus in accordance with claim 9, wherein said inserts are made of wear-resistant materials.

* * * * *